United States Patent [19] [11] Patent Number: 5,013,397
Tsukakoshi [45] Date of Patent: May 7, 1991

[54] PRINTED CIRCUIT BOARD AND METHOD OF PREPARING SAME

[75] Inventor: Hiroshi Tsukakoshi, Iwata, Japan

[73] Assignee: Yamaha Hatsudoki Kabushiki Kaisha, Iwata, Japan

[21] Appl. No.: 240,093

[22] Filed: Sep. 2, 1988

[30] Foreign Application Priority Data

Mar. 10, 1988 [JP] Japan ................................. 63-57729
May 13, 1988 [JP] Japan ............................... 63-117563

[51] Int. Cl.⁵ .......................... B44C 1/22; C23F 1/00; C03C 15/00; C03C 25/06
[52] U.S. Cl. ...................................... 156/631; 29/846; 156/634; 156/656; 156/659.1; 156/902; 156/151; 156/153; 156/233; 156/249
[58] Field of Search ............... 156/629, 150, 630, 151, 156/631, 153, 632, 233, 634, 235, 656, 241, 659.1, 247, 902, 249; 29/846; 174/68.5; 430/313, 314, 315, 318; 204/15; 427/96

[56] References Cited

U.S. PATENT DOCUMENTS

| | | | |
|---|---|---|---|
| 4,159,222 | 6/1979 | Lebow et al. | 156/631 X |
| 4,584,039 | 4/1986 | Shea | 156/150 |
| 4,604,160 | 8/1986 | Murakami et al. | 156/630 |
| 4,722,765 | 2/1988 | Ambros et al. | 156/630 |
| 4,789,423 | 12/1988 | Pelligrino | 156/631 |
| 4,790,902 | 12/1988 | Wada et al. | 156/631 X |

Primary Examiner—William A. Powell
Attorney, Agent, or Firm—Ernest A. Beutler

[57] ABSTRACT

A method of forming printed circuits on an insulating film comprising the steps of forming a panel plating layer, plating the circuits onto the panel plating layer, applying a film to the plated panel plating layer and chemically removing the panel plating layer. In addition, the printed circuit is impressed into the film so as to form a planar surface and a protective film is placed over the film and impressed circuit. The method of making a thermocouple by this process is also disclosed.

39 Claims, 11 Drawing Sheets

PRINTED CIRCUIT BOARD AND METHOD OF PREPARING SAME

BACKGROUND OF THE INVENTION

This invention relates to a printed circuit board and method of preparing such a board and more particularly to an improved and simplified method of making a printed circuit on a film type insulator.

The use of printed circuit boards is well established and well known. Such circuit boards are formed by applying, in some manner, discrete circuitry on an insulating board. Such arrangements have high utility and are used in a wide variety of applications. Although great progress has been made with circuit boards, still further improvement is desirable.

For example, it is well known that a wide number of circuits can be formed on a single board. However, with the present trend toward further miniaturization and with increasing complexity of the circuits, it is desirable to provide a method for forming a printed circuit wherein an even greater number of circuit components may be formed on a given circuit board. Furthermore, in many applications it is desirable to form the circuit on a board that not only is relatively thin but one which may also be flexible. Such film type printed circuit boards have particular utility in electric circuits for cameras, copy machines and the like.

One method in which a printed circuit of this general type has been formed would be to coat a metal layer such as aluminum, copper or the like on the entire surface of a substrate by a PVD method such as vacuum deposition or sputtering or a CVD method. The upper surface of the metal coating is then provided with a photoresistant layer of a given pattern to form the desired circuits. Thereafter, the unprotected portions of the metal layer are removed by etching to form the wiring pattern on the substrate. These methods require a high vacuum technique and manufacturing at a high temperature. Therefore, the type of substrate used is quite limited and the substrates must have a fair degree of thickness. Therefore, this method cannot be used practically on a thin membrane substrate such as a film.

There is another form of process which does not require high vacuum techniques and which can be used to form a wiring pattern on a thin membrane such as a film. In this method, a metal base is electroplated or chemically plated in a given pattern to form the desired circuits. An insulated film is then bonded to this pattern and the film is peeled from the substrate to transfer the wiring pattern to the film. The disadvantage with this type of system is that the peeling of the film can put undue stresses on the discrete circuitry and cause breaks or high resistance in the circuits.

It is, therefore, a principal object of this invention to provide an improved method for forming a printed circuit that lends itself to formation of printed circuits on thin films.

It is a further object of this invention to provide an improved and simplified method for forming printed circuits on a board wherein the board and circuit will be strong and interruptions in the circuitry will not result during the forming process.

It is a further object of this invention to provide an improved and simplified method for forming printed circuits on thin substrates such as films and wherein relatively simple manufacturing techniques can be employed.

In many forms of printed circuits, the substrate on which the circuit has been formed is further protected by bonding an insulating layer to the printed circuit board so that other circuits can be formed on top of the first formed circuit. However, coating of the printed circuit board does not necessarily provide a generally flat surface. Normally, the way coating is accomplished is that the printed circuit board is enveloped within a film. However, the circuitry extends above the circuit board and when the film is put in place, it does not have a perfectly planar surface. In addition, this method of coating or insulating the printed circuit lends itself to the entrapment of air which can cause degradation of the printed circuit.

It is, therefore, a further object of this invention to provide an improved method for applying a protective coating to a printed circuit.

It is another object of this invention to provide a method for coating a printed circuit in such a way that a smooth and perfectly planar layer will result so as to permit stacking of circuits one upon the other.

It is a further object of this invention to provide an improved method for coating a printed circuit board while avoiding the intrusion of air into the coating.

As has been previously noted, one method by which printed circuits can be formed, particularly on film layers, is by depositing a metal on the film layer and then etching the metal to remove unwanted portions to result in the desired circuit formation. Another problem with this etching technique is that the side edges of the printed circuit tend to become tapered being wider at the base where they are attached to the film than at the top. As a result of this decreased cross-sectional area, the circuit components must be wider so as to avoid high resistivity. As a result, the number of circuits that can be employed in a given area is reduced.

This problem is avoided where the circuit is printed onto a substrate, the board is then applied and the board and circuit are stripped from the substrate. However, as has been noted above, such an arrangement tends to put strains on the circuit and may cause it to become cracked or weakened with a further increase in resistivity. It is, therefore, a still further object of this invention to provide an improved method for forming a printed circuit on a board wherein a wide density of circuits can be formed in a given cross-sectional area and the circuits will have low resistivity and be free of cracks.

One application of printed circuits which has recently obtained some interest is the use of such circuits or portions of them as a thermocouple. As is well known, a thermocouple is an electrical device for measuring temperature wherein a pair of dissimilar electrical conductors are connected to each other at a junction. The dissimilar metal junction causes an electrical signal to be given that is related to the temperature of the junction and hence this device can be used for providing temperature indication. It has been proposed to use a printed type circuit for such a thermocouple wherein two dissimilar metals are plated onto an insulating base and in overlying relationship to form the thermocoupled junction. Such devices have wide utility and permit the measuring of temperature variants over a very small surface area or the average temperature of a small area. With such thermocouples, it is extremely important that the junction not be upset and that it be strong and capable of withstanding shock.

It is a further object of this invention to apply the aforenoted methods of forming printed circuit boards of the film type to the formation of a thermocouple.

SUMMARY OF THE INVENTION

A first feature of this invention is adapted to be embodied in a method of making a printed electrical circuit that comprises the steps of forming a panel plating layer. A discrete circuit is plated onto the panel plating layer and a base is applied to the panel plating layer. The panel plating layer is then chemically removed to leave a discrete circuit on the base.

Another feature of the invention is adapted to be embodied in a method of forming a protected printed circuit. This method comprises the steps of depositing a conductive circuit on an insulating substrate. The deposited circuit is then impressed into the substrate to form a generally planar surface and a protective film is applied over the circuit and substrate.

Yet another feature of the invention is adapted to be embodied in a method of making a plated type thermocouple comprising the steps of plating a first metallic conductor on an insulating surface, plating a second metallic conductor of a different material on the insulating surface with a portion overlying the first plated layer so as to form an electrical junction at their ends, applying a base to the plated surface and stripping the base and plated conductors from the surface.

Another feature of the invention is adapted to be embodied in a coated printed electrical circuit. The circuit comprises a base substrate into which a printed circuit is impressed so that the upper surface of the base plate and the printed circuit lie in substantially the same plane. A protective film overlies the upper surface of the substrate and the printed circuit.

Yet another feature of the invention is adapted to be embodied in a thermocouple comprising a base substrate having an opening and a pair of dissimilar metal conductors on the base substrate having overlapping terminal portions formed in the opening.

BRIEF DESCRIPTION OF THE DRAWINGS

FIGS. 1 through 4 and 9 are perspective views while the remaining views are cross-sectional views.

DETAILED DESCRIPTION OF THE PREFERRED EMBODIMENTS OF THE INVENTION

Referring first to FIGS. 1 through 11, a method of forming a printed circuit on a thin film and covering it with a protective layer is disclosed. This method comprises the steps of forming a plating substrate 31 (FIG. 1) from a suitable material such as a stainless steel. The substrate 31 has a relatively heavy thickness and a panel plating layer 32 formed from a dissimilar material, such as aluminum, is plated onto the substrate 31 to a thickness approximately equal to 5 $\mu$m. The specific process for plating the panel plating layer 32 onto the substrate 31 may be of any known type.

Figure 1:
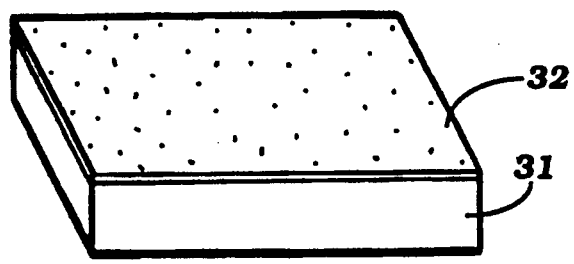
FIGS. 1 through 11 are views showing the sequence of forming a thin film, protected printed circuit in accordance with a first embodiment of the invention.
Figure 2:
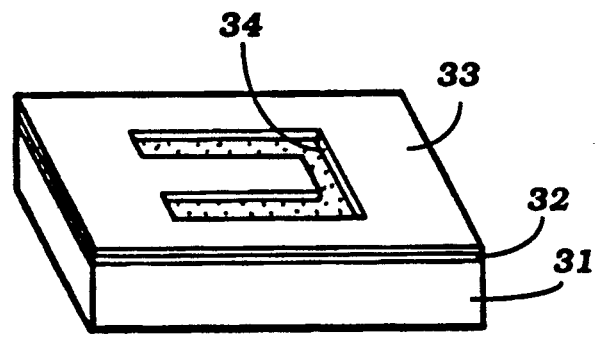
Figure 3:
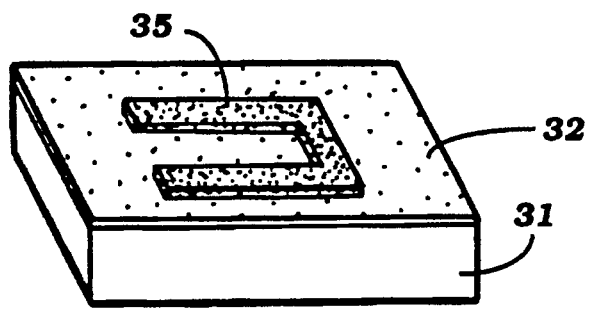

After the panel plating layer 32 is formed, a resist layer 33, which may be formed preferably from a photosensitive resin film is laminated to the panel plating 32 in a suitable manner, as by thermocompression bonding. The resist layer 33 is then masked so as to form the desired circuit pattern and subjected to light exposure and development. In FIG. 2, a very simple configuration in a U shape is shown only for explanatory purposes. It is to be understood that the actual circuit will be much more complicated in configuration. After the light exposure and development, there is formed an opening 34 in the resist layer 33 that forms the configuration of the desired circuitry.

The material then to form the electric circuit is plated into the recess 34. For example, a material such as copper 35 is plated into the recess 34 in a suitable manner. For example, the electroplating used may be a high speed plating method as disclosed in Japanese Patent Publication No. 60-1958, in which the electroplating is preformed while floating a plating liquid with a plating bath over the surface. As a result of this, the surface of the plated material is relatively rough as best seen in magnified view of FIG. 7. The significance of this will become apparent.

Figure 4:
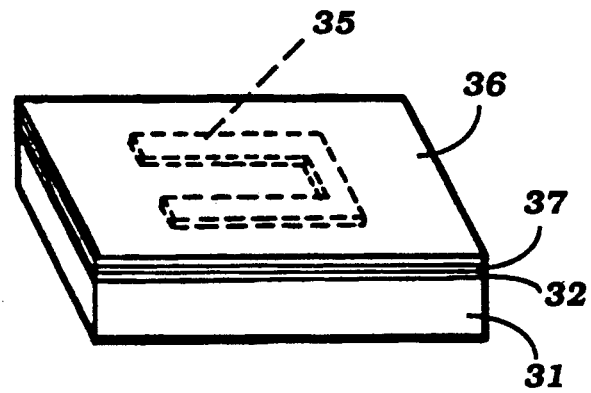
Figure 5:
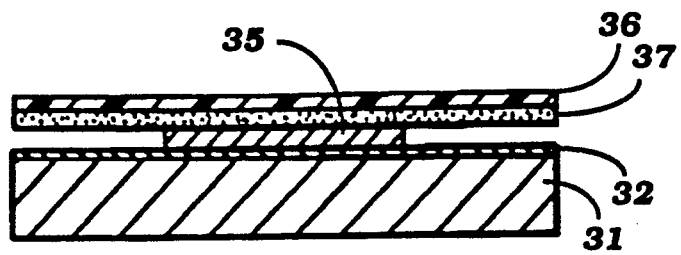
Figure 6:
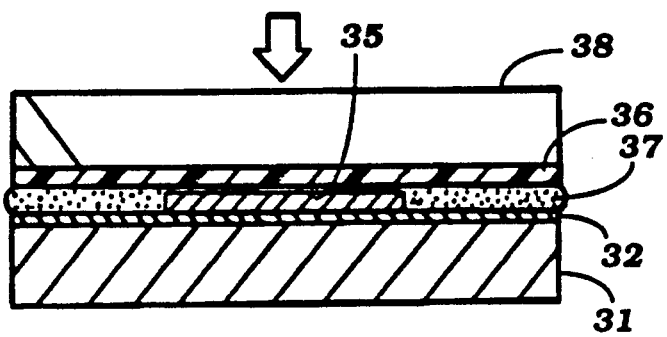
Figure 7:
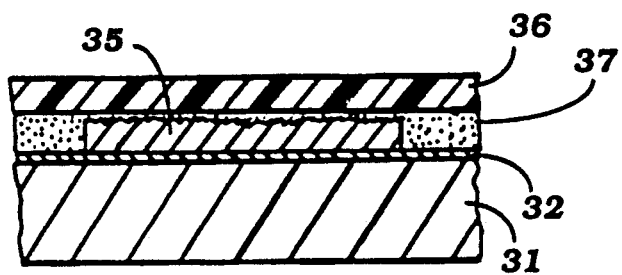

After the circuit 35 is plated onto the panel plating layer 32, an insulating base 36 carrying a bonding adhesive 37 is applied over the circuit 35 as shown in FIGS. 4 and 5. The insulating base 36 may be formed from a suitable film material such as a polymide film and the adhesive 37 may comprise an epoxy adhesive. As seen in FIG. 5, the initial placement of the insulating film 36 and adhesive 37 is such that the adhesive 37 contacts the circuit 36 but is out of registry with the panel plating layer 32. The device is then placed into a press as shown in FIG. 6 and the press plate 38 is brought into engagement with the film 36 so as to compress the adhesive 37 as shown in FIG. 6 so that it moves into full contact with the panel plating layer 32. The press plate 38 may be heated to about 160° and the pressing pressure and pressing time are set to 20 kg/cm² and one hour, respectively. Thus, the bonding agent 37 will fill the entire area around the circuit 35 and move into full registry with the portion of the panel plating layer 32 surrounding this circuit. In addition, the upper surface of the film 36 will be held in a flattened state.

Figure 12:
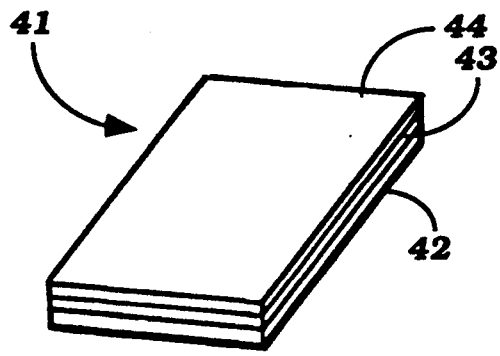
FIG. 12 is a perspective view showing a step in a prior art method of forming a protected printed circuit.
Figure 13:
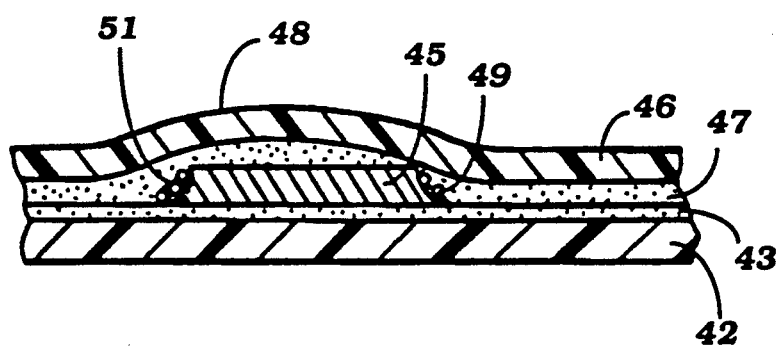
FIG. 13 is an enlarged cross-sectional view of the prior art type of construction.
Figure 14:
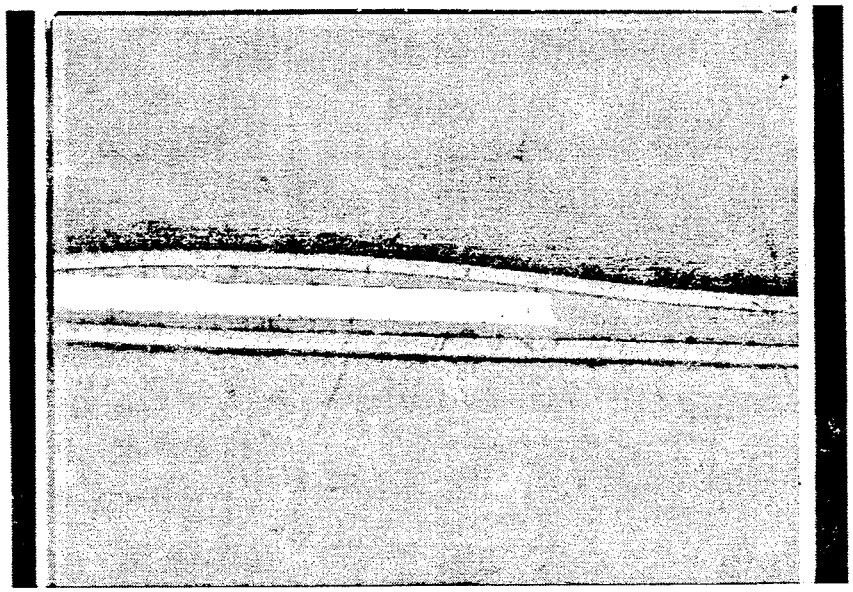
FIG. 14 is a photographic view corresponding to the cross-sectional view of FIG. 13 showing the actual prior art construction.

The importance of flattening the film 36 may be best understood by reference to FIGS. 12 through 14, wherein the prior art type of construction is illustrated. In these figures, an untreated board is indicated at 41 and is comprised of a base plate 42, which may be formed of a material such as copper to which an insulator film 43 having a thickness of approximately 50 μm is applied in a suitable manner. A copper plate 44 is then applied to the film 43 with the copper 44 being utilized to form the printed circuit. The copper 44 is then masked and etched so as to form the final circuit configuration as shown at 45 in FIG. 13.

After the copper circuit 45 is formed, a protective film 46 overlies the printed circuit board and is held in place by an adhesive 47. As may be readily seen from FIG. 13 and the corresponding photograph of FIG. 14, which is an actual cross-sectional photograph, it can be seen that the circuit 45 gives rise to an undulating surface 48. In addition, air bubbles 49 become entrapped around the copper and can cause corrosion and deterioration of the circuit. Furthermore, the edge portions 51 of the copper become truncated or curved in shape due to the etching action and thus the cross-sectional configuration of the circuit is diminished. This must be compensated for by providing a wider than normal surface and thus the number of circuits that can be positioned within a given cross-sectional area is significantly reduced.

The undulating surface 48 makes it impossible or extremely difficult to stack circuits one on top of the other without voids in between.

Figure 15:
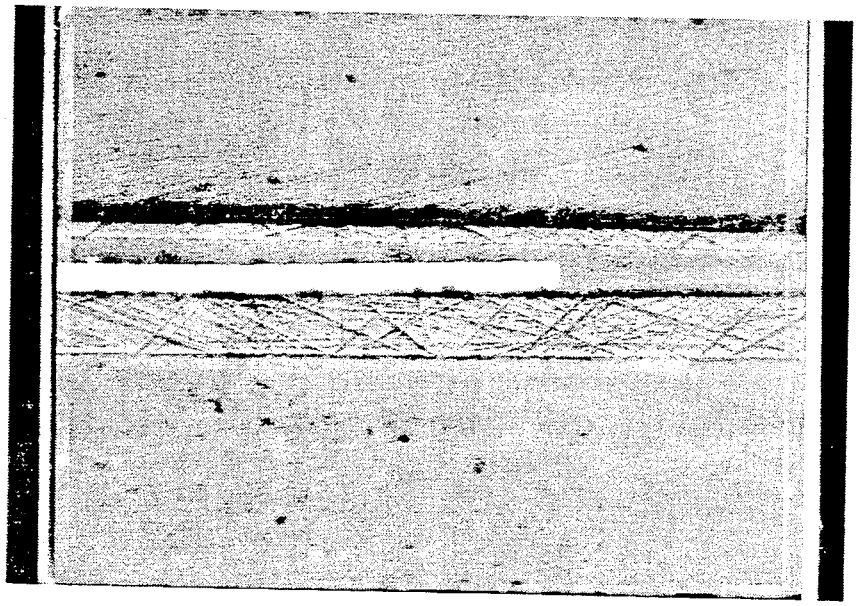
FIG. 15 is a photographic view, in part similar to FIG. 11, showing the resulting product formed in accordance with this invention.

As may be seen in FIG. 15, which is a cross-sectional photograph showing the finished product in accordance with this method, the surface is completely flat and circuits may be readily stacked one on top of the other.

Figure 8:
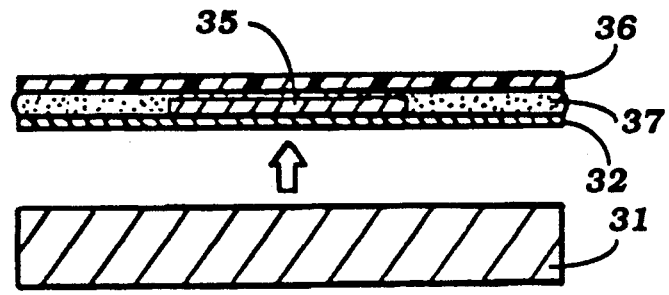

Referring now again to FIGS. 1 through 11 and specifically to FIG. 7, it will be noted that the roughened surface of the circuit 35, which is formed as aforenoted, will increase the adhesion of the film 36 and adhesive 37 to the circuit 35 and panel plating layer 32. This assemblage may then be stripped easily from the base 31 as shown in FIG. 8 without interfering with or deteriorating the circuit in any manner. That is, the adhesive action between the adhesive 37 and the panel plating layer 32 is greater than the adhesion between the panel plating layer 32 and the base 31. This can be accomplished easily when material like stainless steel, aluminum or titanium are used as the base 31, copper or aluminum are used for the circuit 35 and the panel plating layer material is selected from the group of aluminum, zinc, iron or tin.

Figure 9:
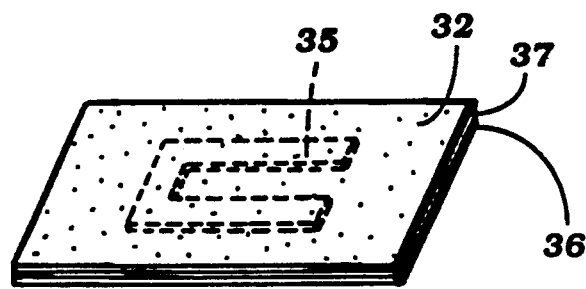
Figure 10:
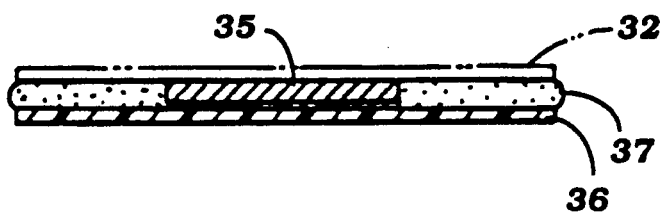
Figure 11:
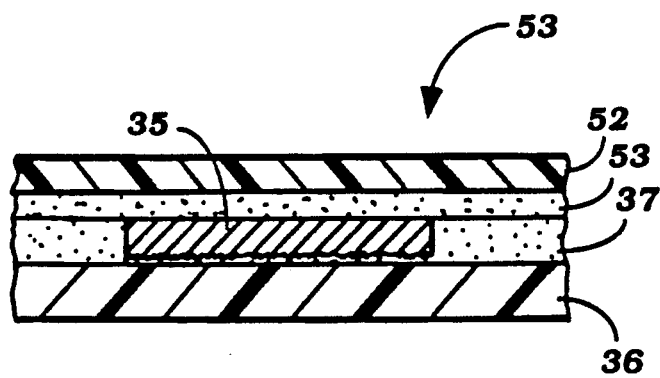

After the printed circuit board with the coating affixed is removed as shown in FIGS. 9 and 10, the panel plating layer 32 is chemically removed. This can be done by immersing the entire assemblage into an alkaline etching liquid such as sodium hydroxide to remove the panel plating layer 32. In order to facilitate the chemical removal of the panel plating layer 32, the material of the panel plating layer should be at least as high and preferably higher on the activity table than the material used for the circuit 35.

Thus, the periphery of the circuit 35 on the upper side of the bonding agent 37 will be in a fully planar condition and will provide a good surface to which a cover film 52 may be applied with an interposed adhesive 53. The cover film 52 provides a final printed circuit board 53 that is completely flat, flexible and in which the circuit 35 is completely protected. Because of the fact that the printed circuit was protected by the film at the time of stripping, the likelihood of damage to the circuit during this operation is substantially reduced and because of the shape of the circuit and the fact that etching was not required, there is no reduction in the cross-sectional area of the circuit components and a thin configuration and a very dense circuitry can be employed. Furthermore, a very thin film having a thickness of 100 μm or less may be used as the base plate 36 so as to increase the flexibility while avoiding any difficulties.

Figure 16:
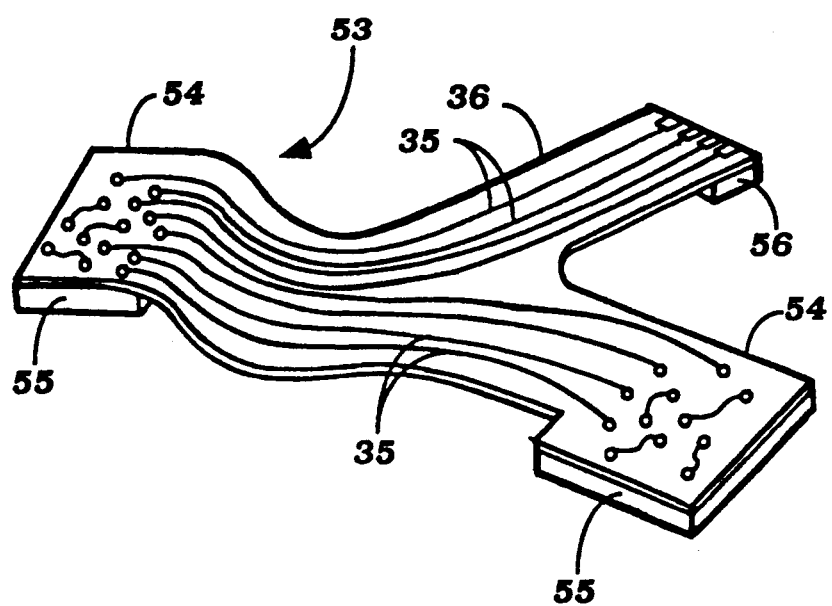
FIG. 16 is a perspective view of a final printed circuit board formed in accordance with the method shown in FIGS. 1 through 11.

FIG. 16 shows an electrical part using a printed circuit board 53 formed in the manner already described. In this example, the printed circuit board 53 is composed of an insulating flexible polymide film base 36 having a wiring pattern 35 formed thereon. The ends 54 of the printed circuit board 53 may be affixed to respective mounting substrates 55 so as to add rigidity to the assembly and afford a means of attachment to an associated circuit. In this figure, the covering film has been deleted for explanatory purposes. It should be noted that the mounting portions 53 or substrates may carry various electrical components or discrete circuits and the circuit to them completed by passing openings through the film 36 to provide electrical contact with the circuit 53. In addition, a terminal board 56 may be formed at one end of the circuits for attachment to an appropriate circuit board. Because of the very flat configuration it is possible to superimpose another board on the board 53 and thus permit a multilayer circuit.

In the embodiment thus far described, the same metal was used for the entire circuit. As will become apparent as this description proceeds, it may be possible to form different materials on the film in overlapping or junction relationship to provide a thermocouple. FIGS. 17 through 24 show how such a thermocouple may be manufactured utilizing the same principals of the invention.

Figure 17:
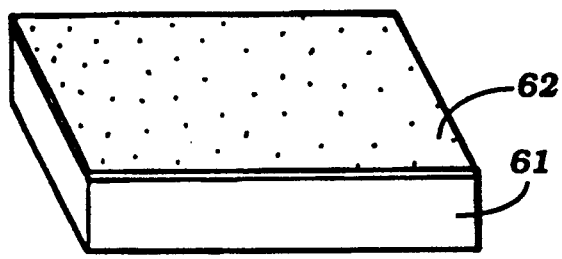
FIGS. 17 through 24 are perspective views showing the steps in the method of forming a thermocouple in accordance with another embodiment of the invention.
Figure 18:
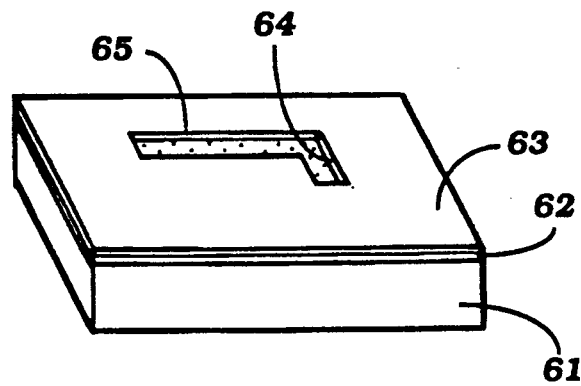

Referring first to FIG. 17, a plating substrate 61, which may be formed from a material similar to the materials forming the base 31 is formed and has deposited on it, by electroplating, a panel plating layer 62. A first resist layer 63, which may be a photosensitive resin film, is then applied to the panel plating layer 62. The resist layer 63 is then masked, subjected to light and developed as aforenoted so as to form a recess in the shape of the desired circuit, which consists of a junction portion 64 and a connecting portion 65 in a generally L shape (FIG. 18).

Figure 19:
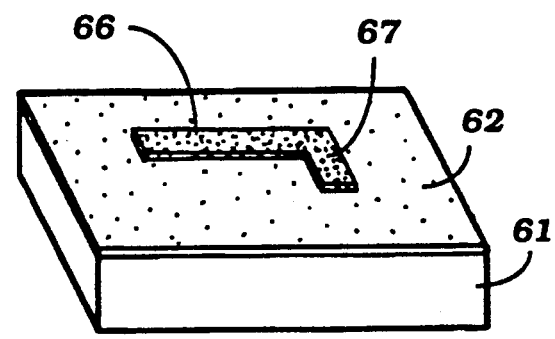
Figure 20:
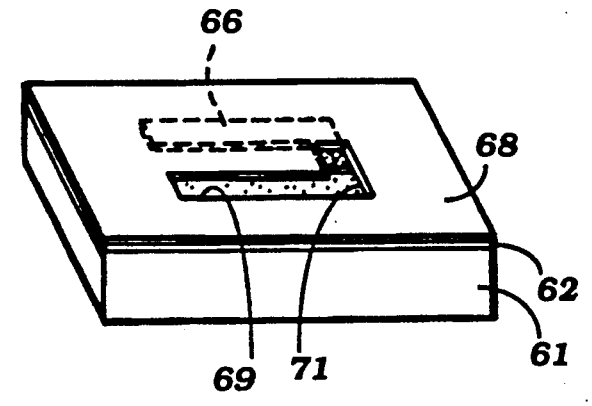

A conductive metal such as copper is then plated into the recess so as to form a first thermoelectric pattern 66 having a junction portion 67. The first resist layer 63 is then removed chemically as aforedescribed (FIG. 19).

Figure 21:
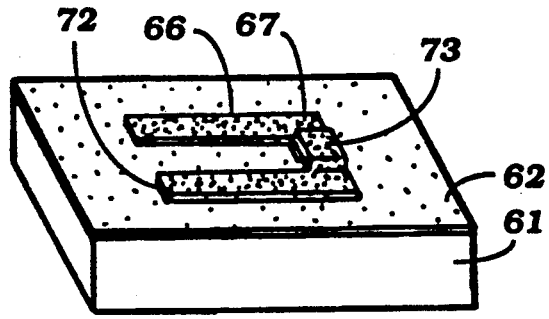
Figure 22:
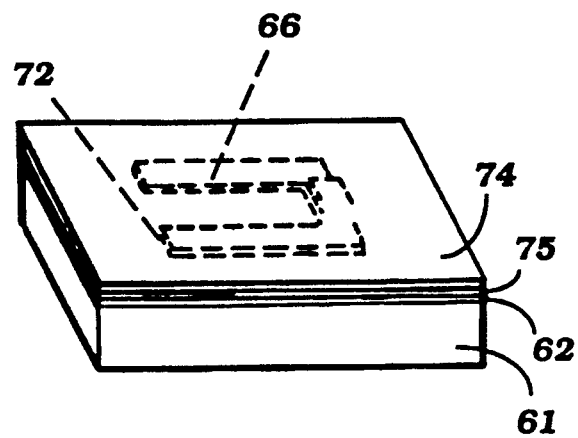

A second resist layer 68 is then applied to the panel plating layer 62 and over the first thermoelectric pattern 66. The second resist layer 68 is then masked, exposed and developed so as to form a second recess consisting of a terminal section 69 and a junction section 71. It should be noted that the junction section 71 overlies the junction section 67 of the first thermoelectric pattern 66, for a reason which will become apparent. A second material having a different metallic property is then plated into the recess 69 and 71, this second material being such as nickel so as to form a terminal portion 72 and a junction portion 73. The junction portion 73 overlies in part the junction portion 67 of the first thermoelectric pattern 66. The second resist layer 68 is then removed so as to expose the circuitry as shown in FIG. 21.

A thin film 74 and bonding adhesive 75 are then applied over the exposed thermocouple consisting of the thermoelectric portions 66 and 72 and compressed as in the previously described embodiments. This assemblage including the panel plating layer 62 then stripped in the manner as aforenoted so as to be removed from the base 61. This removal will not effect the electrical circuitry for the reasons already described.

Figure 23:
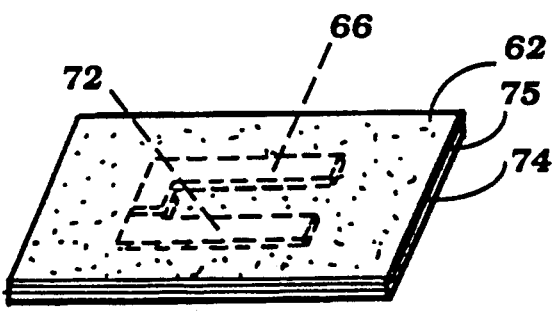
Figure 24:
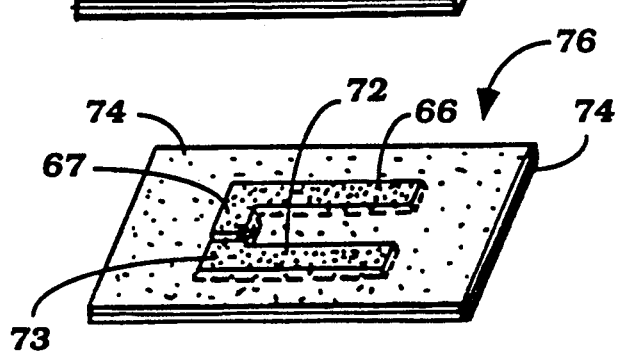

After the arrangement is removed as shown in FIG. 23, the panel plating layer 62 is removed, as by chemical stripping in the manner as aforedescribed. This results in the formation of an electrical, film type thermocouple 76 as shown in FIG. 24. It should be noted from FIG. 24 that the construction of this arrangement is such that although the terminal portions 73 and 67 are in overlapping relationship, the exposed surface is the surface which was previously occupied by the panel plate layer 62 and hence the surface is completely flat. This lends itself to a wide variety of applications because of the compact configuration and provides an extremely good thermocouple.

Figure 25:
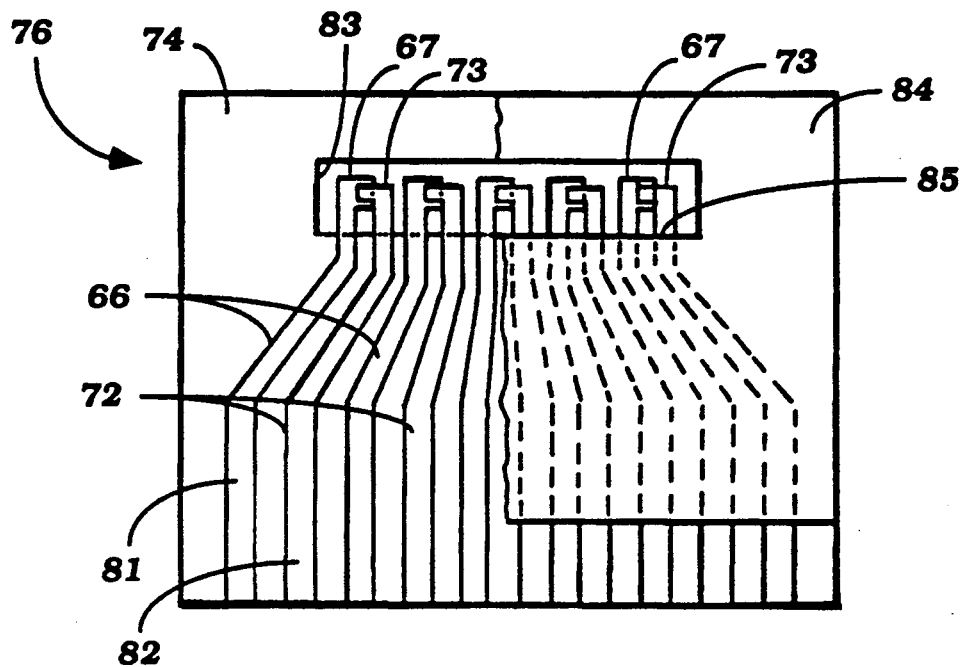
FIG. 25 is a top plan view of the resulting thermocouple, with a portion of the protective coating removed.

FIG. 4 shows an actual thermocouple 76 which can be utilized in conjunction with the invention and which depicts the more complicated arrangement actually formed in which a plurality of thermocouple pairs are carried on the same film so a to serve the function of providing either average temperature measurement or a temperature gradient along a surface. As has been previously noted, the methods described are useful in forming a number of circuits on a given film even though only a single circuit was illustrated in the descriptive embodiments. As seen in FIG. 25, there are provided five thermocouple pairs having overlapping junctions 67 and 73 carried on an insulating film base plate 73. In this embodiment, the terminal portions 66 and 72 of the thermocouple pairs are extended as at 81 and 82 to the edge of the film 73 so as to afford connection to an associated circuit for providing a measuring signal.

In the specific embodiment illustrated, the measuring contacts 67 and 73 span an area having a width of about 3 mm. The film 73 is provided with a cut out area 83 so that the junctions 67, 73 will be exposed from both sides and can sense temperature at both sides. In this embodiment, there is also provided a protective layer 84 which is also cut out at 85 so as to expose the terminals.

In this embodiment, the base film 73 is formed from a polymide sheet having a thickness of 150 $\mu$m and the thermocouple pairs 66 and 72 are formed respectively from copper and nickel and have a width of 150 $\mu$m and a thickness of 30 $\mu$m at the measuring contact point. Of course, different dimensions can be utilized and different thermocouple pairs or materials implied depending upon the particular temperature range to be measured in the enviroment.

The openings 83 and 85 in the film 73 and protective covering 84 are formed in the step of the process shown in FIGS. 17 through 24 by the use of having openings formed initially in the base film 73 and the cover film 84. Even though the base film 73 is removed in the area of the junction 67 and 73, it has been found that there is no difficulty in upsetting the junctions when they are peeled from the panel plating layer 62 since the remainder of the film and backing material covers the major portion of the terminals.

Figure 26:
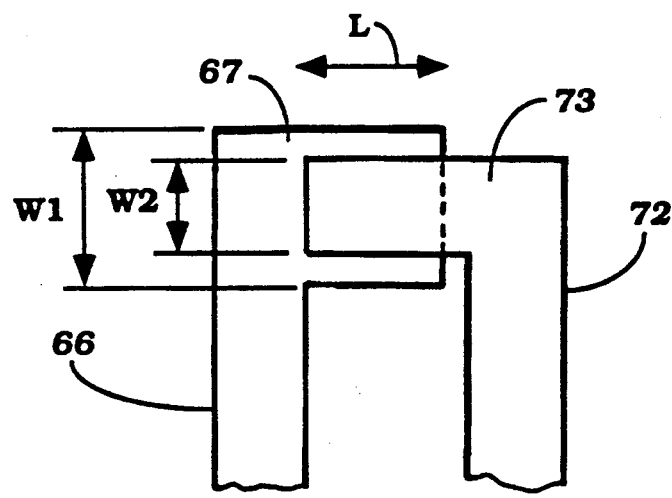
FIG. 26 is an enlarged prospective view showing the junction of the thermocouple.

In an arrangement where there are a plurality of thermocouple pairs mounted on the same film, it is desirable to insure that the overlapping area of the thermocouple junctions is equal. Such equal areas are required in order to insure that each terminal pair will have exactly the same temperature response characteristics. Referring to FIG. 26, it will be illustrated how this can be achieved. This is done by insuring that the terminal leg 67 of the first deposited thermocouple material has a greater width W1 than the second leg 73 of the other thermocouple material. The overlapping portions L of the legs are such that the width W2 of the portion 73 may be adjusted upon manufacturing so as to insure that the cross-sectional areas are the same. Thus, the accuracy of position adjustment can be improved since the areas of the junction portions of the respective pairs can be easily adjusted relative to each other by varying the dimension W2 in relation to the overlapping length L.

Figure 27:
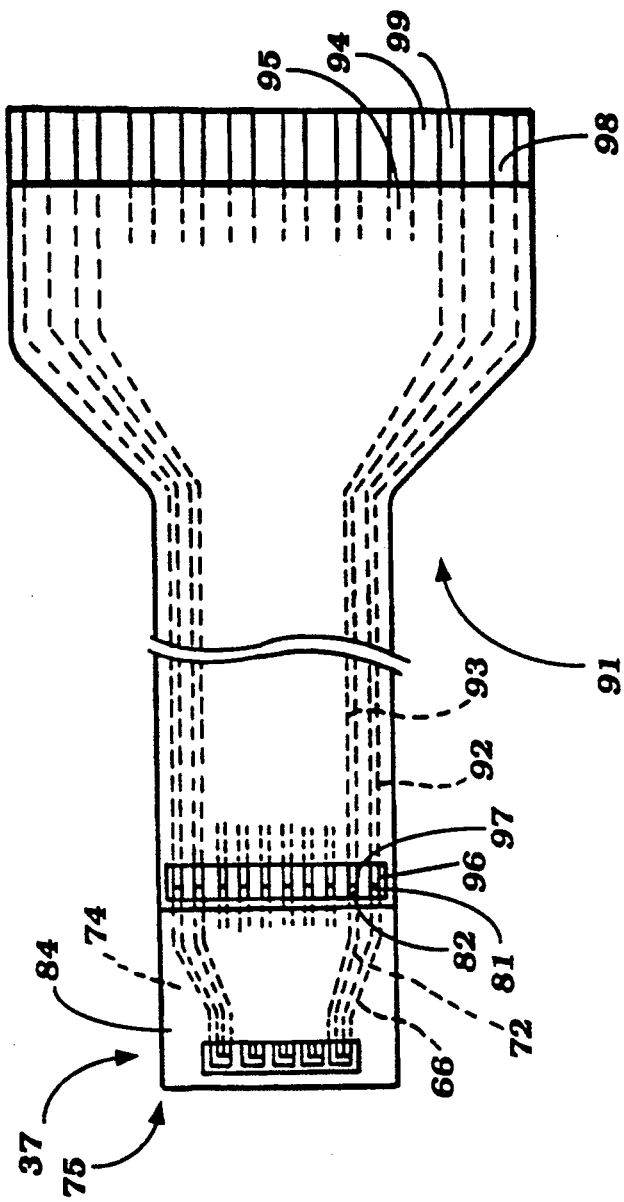
FIG. 27 is a view in part similar to FIG. 25 showing how the thermocouple can be used in conjunction with a circuit.

FIG. 27 illustrates how a thermocouple pair film 76 in accordance with FIG. 25 can be employed in a complete circuitry. It was previously noted that the thermocouple pairs have extending portions 82 and 82 that extend to the end of the film so as to afford a junction. A compensating lead wire unit 91, which may be formed in the same manner as the other film circuits previously described, is provided with first and second compensating patterns 92 and 93 formed from copper and nickel on a base plate 94 formed with an insulating film 95. The first and second compensating patterns have one of their ends 96 and 97 suitably connected, as by soldering, to the thermocouple pair portions 81 and 82. The other ends 98 and 99 of the compensating leads 92 and 93 are provided with wider terminals so as to connect them to an associated circuit.

It should be readily apparent from the foregoing description that a number of embodiments of the invention have been illustrated and described and each of which permits the formation of a printed circuit on a thin film with maximum density and without the likelihood that the circuits will be damaged during production. In some embodiments, these circuits may form portions of thermocouples.

In the described embodiments the printed circuit is formed on a thin film base. It is to be understood that certain facets of the invention may be employed in conjunction with circuits that are formed on rigid thick plates rather than flexible films.

It is to be understood that the foregoing description is that of a preferred embodiment of the invention and that various changes and modifications may be made without departing from the spirit and scope of the invention, as defined by the appended claims.

What is claimed is:

1. The method of making a printed electrical circuit comprising the steps of forming a panel plating layer, plating a discrete circuit onto said panel plating layer, applying an adhesive and an overlying base to the plated panel plating layer applying pressure to said base and said plated panel plating layer to completely embed said discrete circuit into said adhesive with said adhesive separating said base from said circuit, and chemically removing the panel plating layer to leave the discrete circuits on the base.

2. The method of making a thin film electrical circuit as set forth in claim 1 wherein the base comprises a thin film.

3. The method of making a thin film electrical circuit as set forth in claim 2 wherein the panel plating layer is formed on a plating substrate and the panel plating layer and plated circuits are removed from the plating substrate by stripping.

4. The method of making a thin film electrical circuit as set forth in claim 3 wherein the stripping is facilitated by forming the panel plating layer and the plating substrate from materials having less adhesion than the adhesion of the film to the plated circuit.

5. The method of making a thin film electrical circuit as set forth in claim 4 wherein the adhesion between the film and the plated circuit is improved by providing a rough service on the plated circuit.

6. The method of making a thin film electrical circuit a set forth in claim 5 wherein the panel plating layer is formed from a material that is more readily attacked by the chemical action than the plated circuit.

7. The method of making a thin film electrical circuit as set forth in claim 3 wherein the panel plating layer is chemically deposited on the plating substrate.

8. The method of making a thin film electrical circuit as set forth in calim 7 wherein the discrete circuits are plated onto the panel plating layer by providing a resist coat on the panel plating layer and removing the area where the circuits are to be formed.

9. The method of making a thin film electrical circuit as set forth in claim 8 wherein the resist coat is removed by a photographic process and the resist coat is a photosensitive material.

10. The method of making a thin film electrical circuit as set forth in claim 9 wherein the stripping is facilitated by forming the panel plating layer and the plating substrate from materials having less adhesion than the adhesion of the film to the plated circuit.

11. The method of making a thin film electrical circuit as set forth in claim 10 wherein the adhesion between the film and the plated circuit is improved by providing a rough service on the plated circuit.

12. The method of making a thin film electrical circuit as set forth in claim 11 wherein the panel plating layer if formed from a material that is more readily attacked by the chemical action than the plated circuit.

13. The method of making a printed electrical circuit as set forth in claim 1 further including the step of applying a protective coating over the adhesive on to the base and the discrete circuitry after the panel plating layer has been chemically removed.

14. The method of making a thin film electrical circuit as set forth in claim 13 wherein the base comprises a thin film.

15. The method of making a printed electrical circuit as set forth in claim 14 wherein the panel plating layer is formed on a plating substrate and the panel plating layer and plated circuits are removed from the plating substrate by stripping.

16. The method of making a printed electrical circuit as set forth in claim 15 wherein the stripping is facilitated by forming the panel plating layer and the plating substrate from materials having less adhesion than the adhesion of the film to the plated circuit.

17. The method of making a printed electrical circuit as set forth in claim 16 wherein the adhesion between the film and the plated circuit is improved by providing a rough service on the plated circuit.

18. The method of making a printed electrical circuit as set forth in claim 17 wherein the panel plating layer is formed from a material that is more readily attacked by the chemical action than the plated circuit.

19. The method of making a printed electrical circuit as set forth in claim 18 wherein the panel plating layer is chemically deposited on the base layer.

20. The method of making a thin film electrical circuit as set forth in claim 19 wherein the discrete circuits are plated onto the panel plating layer by providing a resist coat on the panel plating layer and removing the area where the circuits are to be formed.

21. The method of making a printed electrical circuit as set forth in claim 20 wherein the resist coat is removed by a photographic process and the resist coat is a photosensitive material.

22. The method of making a printed electrical circuit as set forth in claim 19 wherein the stripping is facilitated by forming the panel plating layer and the base layer from materials having less adhesion than the adhesion of the film to the plated circuit.

23. The method of making a printed electrical circuit as set forth in claim 22 wherein the adhesion between the base and the plated circuit is improved by providing a rough service on the plated circuit.

24. The method of making a printed electrical circuit as set forth in claim 23 wherein the panel plating layer is formed from a material that is more readily attacked by the chemical action than the plated circuit.

25. The method of making a thin film electrical circuit as set forth in claim 2 wherein a pair of overlapping terminals formed from different metals comprise the plated circuit whereby the film operates as a thermocouple.

26. The method of making a thermocouple as set forth in claim 25 wherein the panel plating layer is formed on a plating substrate and the panel plating layer and plated circuits are removed from the plating substrate by stripping.

27. The method of making a thermocouple as set forth in claim 26 wherein the stripping is facilitated by forming the panel plating layer and the plating substrate from materials having less adhesion than the adhesion of the film to the plated circuit.

28. The method of making a thermcouple as set forth in claim 27 wherein the adhesion between the film and the plated circuit is improved by providing a rough service on the plated circuit.

29. The method of making a thermocouple as set forth in claim 28 wherein the panel plating layer is formed from a material that is more readily attacked by the chemical action than the plated circuit.

30. The method of making a thermocouple as set forth in claim 26 wherein the panel plating layer is chemically deposited on the plating substrate.

31. The method of making a thermocouple as set forth in claim 30 wherein the discrete circuits are plated onto the panel plating layer by providing a resist coat on the panel plating layer and removing the area where the circuits are to be formed.

32. The method of making a thermocouple as set forth in claim 31 wherein the resist coat is removed by a photographic process and the resist coat is a photosensitive material.

33. The method of making a thermocouple as set forth in claim 32 wherein the stripping is facilitated by forming the panel plating layer and the plating substrate from materials having less adhesion than the adhesion of the adhesive to the plated circuit.

34. The method of making a thermocouple as set forth in claim 33 wherein the adhesion between the film and the plated circuit is improved by providing a rough service on the plated circuit.

35. The method of making a thermocouple as set forth in claim 34 wherein the panel plating layer is formed from a material that is more readily attacked by the chemical action than the plated circuit.

36. The method of forming a protected printed circuit comprising the steps of depositing a conductive circuit on an adhesive coated insulating substrate, impressing the deposited circuit into the adhesive to form a generally planar surface, and applying a protective film over the circuit and substrate.

37. The method of making a thin film electrical circuit as set forth in claim 36 wherein the base comprises a thin film.

38. The method of making a plated film type thermocouple comprising the steps of plating a first metallic conductor on an insulating surface, plating a second metallic conductor of a different material on the insulating surface with a portion overlying the first plated layer so as to form an electrical junction at their ends, applying an adhesive coated film to the plated surface, applying pressure to the film and adhesive to embed the plated conductor in said film and stripping the film and plated conductors from the surface.

39. The method of making a plated film type thermocouple as set forth in claim 38 wherein the film has an opening in the area of the junction between the conductors.

* * * * *